US012738930B2

(12) United States Patent
Mo et al.

(10) Patent No.: US 12,738,930 B2
(45) Date of Patent: Sep. 15, 2026

(54) CLOCK CIRCUIT

(71) Applicant: NXP B.V., Eindhoven (NL)

(72) Inventors: Yikun Mo, Suzhou (CN); Hongyan Yao, Suzhou (CN); Yizhong Zhang, Suzhou (CN); Jianluo Chen, Suzhou (CN); Xinhao Miao, Nantong (CN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 19/208,964

(22) Filed: May 15, 2025

(65) Prior Publication Data

US 2025/0364978 A1 Nov. 27, 2025

(30) Foreign Application Priority Data

May 24, 2024 (CN) ........................ 202410657891.1

(51) Int. Cl.

*H03K 5/00* (2006.01)
*G06F 1/08* (2006.01)
*H03F 3/45* (2006.01)

(52) U.S. Cl.

CPC ........... *H03K 5/00006* (2013.01); *G06F 1/08* (2013.01); *H03F 3/45475* (2013.01)

(58) Field of Classification Search

CPC ... H03K 5/00006; G06F 1/08; H03F 3/45475; H03L 7/097; H03L 7/18; H03L 7/093

USPC .......................................................... 327/291

See application file for complete search history.

(56) References Cited

U.S. PATENT DOCUMENTS

| | | | | |
|---|---|---|---|---|
| 8,994,459 | B2 * | 3/2015 | Patasani | H03L 7/02 331/34 |
| 10,250,269 | B2 | 4/2019 | Verlinden et al. | |
| 11,476,838 | B1 * | 10/2022 | Derksen | H03L 7/02 |
| 2009/0045880 | A1 * | 2/2009 | Vanselow | H03L 7/02 331/25 |

(Continued)

FOREIGN PATENT DOCUMENTS

CN 114978163 A 8/2022

OTHER PUBLICATIONS

Erwin Szopos et al.: "Discrete Domain Modeling of an All-Digital Frequency Locked Loop", 2017 International Semiconductor Conference (CAS), Conference Location: Sinaia, Romania, Date of Conference: Oct. 11-14, 2017, pp. 247-250.

(Continued)

*Primary Examiner* — Ryan Jager

(57) ABSTRACT

A clock circuit comprising a voltage-controlled oscillator having an input coupled to an output of an amplifier, and an output, outputting an output clock signal. The clock circuit further comprises, a reference branch and a feedback branch, both comprising, a first switch coupled to an input via an inverter and a second switch coupled to the input. The branches also both comprise, a variable capacitor coupled to a reference potential and coupled to the first switch, and a variable resistor coupled to the first switch. Both branches comprise a supply voltage coupled to the variable resistor and an output node, wherein the second switch is coupled to the variable capacitor and coupled to a node. The reference branch input is an input clock signal and the output is a reference voltage, and the feedback branch input is an output clock signal and the output is a feedback voltage.

20 Claims, 2 Drawing Sheets

(56) References Cited

U.S. PATENT DOCUMENTS

| | | | | |
|---|---|---|---|---|
| 2009/0284320 | A1* | 11/2009 | Huang | H03L 1/00 331/109 |
| 2015/0180483 | A1* | 6/2015 | Astrom | H03L 7/18 331/25 |
| 2016/0211852 | A1* | 7/2016 | Kim | H03K 3/011 |
| 2018/0351509 | A1* | 12/2018 | Zhang | H03B 5/04 |
| 2019/0028110 | A1* | 1/2019 | Verlinden | H03K 5/2481 |
| 2019/0149140 | A1* | 5/2019 | Han | H03K 3/011 331/8 |

OTHER PUBLICATIONS

A. Žamboki et al., "Low-power frequency-locked loop circuit with short settling time," 2022 45th Jubilee International Convention on Information, Communication and Electronic Technology (MIPRO), Date of Conference: May 23-27, 2022, pp. 174-179.

Leo Gočan et al.: "Low-Power Frequency-Locked Loop Circuit with Static Frequency Offset Cancellation", 2023 46th MIPRO ICT and Electronics Convention (MIPRO), Conference Location: Opatija, Croatia, Date of Conference: May 22-26, 2023, pp. 190-195.

Choi Myungjoon et al.: "A 110 nW Resistive Frequency Locked On-Chip Oscillator with 34.3 ppm/° C Temperature Stability for System-on-Chip Designs", IEEE Journal of Solid-State Circuits, IEEE, USA, vol. 51, No. 9, Sep. 1, 2016, pp. 2106-2118, Sep. 2016.

* cited by examiner

CLOCK CIRCUIT

CROSS-REFERENCE TO RELATED APPLICATIONS

This application claims priority under 35 U.S.C. § 119 to Chinese patent application no. 202410657891.1, filed 24 May 2024, the contents of which are incorporated by reference herein.

FIELD OF INVENTION

This invention relates to a clock circuit.

BACKGROUND OF THE INVENTION

In modern microcontroller units (MCUs) and microprocessor units (MPUs) clocks with various kinds of frequencies are needed. Usually, an output clock is generated whose frequency is proportional to a reference clock frequency, dependent on programmable variables. Previous clocks have been affected by variables such as process, voltage, and temperature variation causing them to not produce the required frequency.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect, there is provided a clock circuit comprising:

- an amplifier having a first input, a second input, and an output;
- a voltage controlled oscillator having an input coupled to the output of the amplifier and an output for outputting an output clock signal of the clock circuit;
- a reference branch comprising:
  - an input for receiving an input reference clock signal having a frequency $f_{in}$;
  - a first switch coupled to the input via an inverter, for control of the first switch by the input reference clock signal;
  - a second switch coupled to the input, for control of the second switch by the input reference clock signal;
  - a variable capacitor having a first terminal coupled to a reference potential and a second terminal coupled to a first terminal of the first switch;
  - a variable resistor having a first terminal coupled to a second terminal of the first switch;
  - a supply voltage node coupled to a second terminal of the variable resistor; and
  - an output node coupled between the first terminal of the variable resistor and the second terminal of the first switch to output a reference voltage of the reference branch to the first input of the amplifier;
  - wherein the second switch has a first terminal coupled to the first terminal of the variable capacitor and a second terminal coupled to a node between the second terminal of the variable capacitor and the first terminal of the first switch; and
- a feedback branch comprising:
  - a feedback input coupled to the output of the voltage controlled oscillator for receiving the output clock signal of the clock circuit;
  - a first switch coupled to the feedback input via an inverter, for control of the first switch by the output clock signal of the clock circuit;
  - a second switch coupled to the feedback input, for control of the second switch by the output clock signal of the clock circuit;
  - a variable capacitor having a first terminal coupled to the reference potential and a second terminal coupled to a first terminal of the first switch of the feedback branch;
  - a variable resistor having a first terminal coupled to a second terminal of the first switch of the feedback branch;
  - a supply voltage node coupled to a second terminal of the variable resistor of the feedback branch; and
  - an output node coupled between the first terminal of the variable resistor of the feedback branch and the second terminal of the first switch of the feedback branch to output a feedback voltage of the feedback branch to the second input of the amplifier;
  - wherein the second switch of the feedback branch has a first terminal coupled to the first terminal of the variable capacitor of the feedback branch and a second terminal coupled to a node between the second terminal of the variable capacitor of the feedback branch and the first terminal of the first switch of the feedback branch.

According to embodiments, a clock circuit is provided that uses a frequency to voltage converter structure built by the variable resistor and the variable capacitor to form an analog frequency lock loop. Using this arrangement, the ratio between output clock signal and input reference clock signal can be made flexible. Variations with process, temperature, supply voltage or aging effects may be removed.

In one embodiment, the reference branch also comprises a filter capacitor, having a first terminal coupled to the reference potential of the reference branch and a second terminal coupled to the output node of the reference branch. The effect of this filter capacitor is to suppress the voltage ripple on the output node of the reference branch.

In some embodiments, the feedback branch comprises a filter capacitor, having a first terminal coupled with the reference potential of the feedback branch and a second terminal coupled to the output node of the feedback branch. The effect of this filter capacitor is to suppress the voltage ripple on the output node of the feedback branch.

In one embodiment, the reference branch further comprises an N divider coupled between the input of the reference branch and the first switch and the second switch of the reference branch. The effect of the N divider is to compensate for large frequency differences when the needed output frequency is much higher than the input reference frequency.

In one embodiment, the feedback branch further comprises an M divider coupled between the feedback input and the output of the voltage controlled oscillator. The effect of the M divider is to compensate for large frequency differences when the needed output frequency is much lower than the input reference frequency.

According to an embodiment, the M divider and the N divider are programmable, for compensating for frequency differences between the input reference clock signal and the output clock signal.

In one embodiment, the clock circuit comprises a Low Dropout Regulator, LDO, coupled to the amplifier, for supplying power to the amplifier and suppressing noise from the supply voltage.

In one embodiment, the clock circuit comprises a chopper, coupled to the input of the amplifier, for eliminating a main output frequency error and a drift contributor.

According to an embodiment, the clock circuit comprises, wherein the clock circuit comprises a third branch, comprising:

- a node coupled between the output node of the reference branch and the first input of the amplifier and;
- a resistor, with a first terminal coupled to the node;
- a switch, with a first terminal coupled to a second terminal of the resistor; and
- a supply voltage, with a first terminal coupled to the second terminal of the switch.

In one embodiment, the clock circuit further comprises a first multiplexer, having a first input coupled to the input reference clock signal, a second input coupled to the output of the voltage controlled oscillator and an output coupled to the first switch and the second switch of the reference branch.

In one embodiment, the clock circuit also comprises a second multiplexer, having a first input coupled to the output of the voltage controlled oscillator, a second input coupled with the input reference clock signal and an output coupled to the first switch and the second switch of the reference branch.

In some embodiments, the variable resistor of the reference branch and the variable resistor of the feedback branch are programmable, for compensating for frequency differences between the input reference clock signal and the output clock signal.

According to an embodiment, the variable capacitor of the reference branch and the variable resistor of the feedback branch are programmable, for compensating for differences in resistance between the variable resistor of the reference branch and the variable resistor of the feedback branch.

According to another aspect, there is provided a microcontroller unit, MCU, including a clock circuit of the kind set out above.

According to a further aspect, there is provided a microprocessor unit, MPU, including a clock circuit of the kind set out above.

BRIEF DESCRIPTION OF DRAWINGS

Embodiments of this disclosure will be described hereinafter, by way of example only, with reference to the accompanying drawings in which like reference signs relate to like elements and in which.

DETAILED DESCRIPTION

Embodiments of the present disclosure are described in the following with reference to the accompanying drawings.

Figure 1:
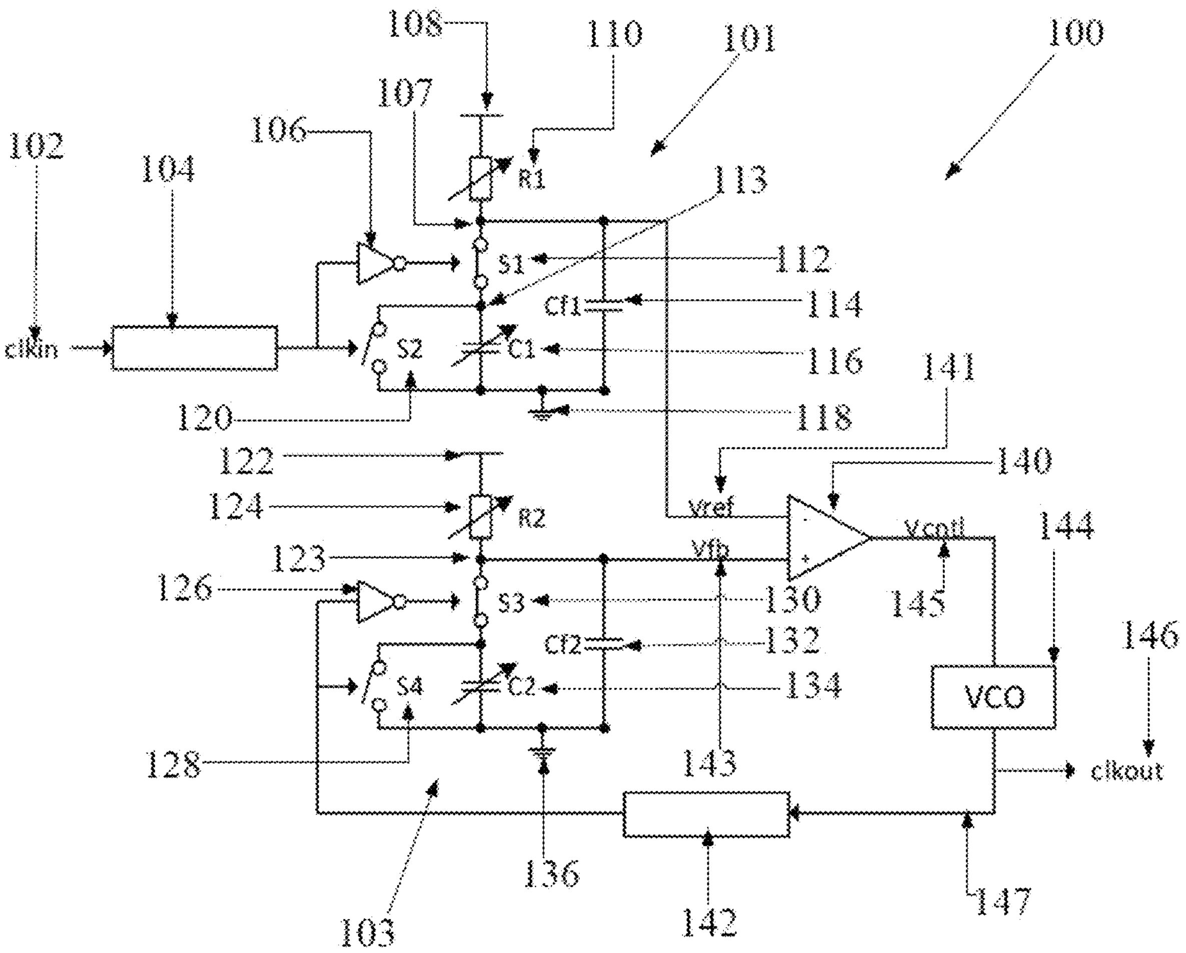
FIG. 1 shows a clock circuit, according to an embodiment.

FIG. 1 illustrates a clock circuit 100 in accordance with an embodiment. The clock circuit 100 includes an amplifier 140. The amplifier 140 in this example includes a first input 141, a second input 143 and an output 145 as will be described in greater detail below. The output 145 of the amplifier 140 is coupled to a voltage controlled oscillator (VCO) 144, having an output for outputting an output clock signal 146 of the clock circuit 100.

As shown in FIG. 1, the clock circuit 100 includes a reference branch 101. The reference branch 101 receives an input reference clock signal 102 (clkin) which has a frequency, $f_{in}$. The input reference clock signal 102 may pass through an N divider 104, which divides the frequency, $f_{in}$, by N (where Nis an integer). The N divider 104 value may be programmable for reasons that will be described in greater detail below. The input reference clock signal 102 outputted from the N divider 104 may be used to control a first switch 112 (S1) and a second switch 120 (S2) of the reference branch 101, where the input to the first switch 112 is coupled to the input reference clock signal 102 (and optional N divider 104) via an inverter 106. The inverter 106 may operate to provide alternating signals to the first switch 112 and to the second switch 120, so that when the first switch 112 is open the second switch 120 is closed, or vice versa.

In the present example, the reference branch 101 includes a variable capacitor 116 (C1) having a first terminal coupled to a reference potential 118 and a second terminal coupled to a first terminal of the first switch 112. The reference potential 118 may, for instance, be ground. The reference branch 101 further includes a variable resistor 110 (R1) having a first terminal coupled to a second terminal of the first switch 112 and a second terminal coupled to a supply voltage 108. The variable resistor 110 and the variable capacitor 116 may be programmable for reasons that will be described in greater detail below.

In this embodiment, the reference branch 101 includes an output node 107. The output node 107 is coupled between the first terminal of the variable resistor 110 and the second terminal of the first switch 112. The output node 107 is configured to output a reference voltage $V_{ref}$ of the reference branch 101 to the first input 141 of the amplifier 140. Notably, the second switch 120 has a first terminal coupled to the first terminal of the variable capacitor 116 and a second terminal coupled to a node 113 between the second terminal of the variable capacitor 116 and the first terminal of the first switch 112.

In this embodiment, the function of the reference branch 101 is to convert a frequency signal, namely the input reference clock signal 102, into the reference voltage, $V_{ref}$ to provide to the amplifier 140. As noted above, the first switch 112 and the second switch 120 are controlled by the input reference clock signal 102. When the second switch 120 is closed (whereby the first switch 112 is open), the variable capacitor 116 discharges to the reference potential 118 (e.g. ground). On the other hand, when the second switch 120 is open (whereby the first switch 112 is closed), the variable capacitor 116 begins charging. This process can create a switching capacitance resistor between the reference potential 118 to the output node 107. The equivalent resistance, $R_{ref}$, of the switching capacitance resistor of the reference branch 101 has the value:

$$R_{ref} = N/(C1 * f_{in}) \quad \text{(Eq. 1)}$$

where:

C1=capacitance of the variable capacitor 116,

N=N divider 104 (integer value), and $f_{in}$=frequency of the input reference clock signal 102.

The switching capacitance resistor of the reference branch 101 and the variable resistor 110 divide the supply voltage 108, $V_{supply}$, giving a reference voltage, $V_{ref}$, on the output node 107 having a value:

$$V_{ref} = \frac{V_{supply} * R1}{(R1 + R_{ref})} \quad \text{(Eq. 2)}$$

where:

R1=resistance of the variable resistor 110.

As shown in FIG. 1, the clock circuit 100 also includes a feedback branch 103. The feedback branch 103 receives a feedback input 147 coupled to the output of the VCO 144 for receiving the output clock signal 146 (clkout, having a frequency $f_{out}$) of the clock circuit 100. The feedback input 147 may pass through an M divider 142 which can divide the frequency, $f_{out}$, by a programmable (integer) value M for reasons that will be described in greater detail below (note that M and N may have different values or may be the same value). The output clock signal 146 outputted from the M divider 142 may be used to control a first switch 130 (S3) and a second switch 128 (S4) of the feedback branch 103, where the input to the first switch 130 is coupled to the feedback input 147 via an inverter 126 (and the optional M divider 142). The inverter 126 may operate to provide alternating signals to the first switch 130 and to the second switch 128, so that when the first switch 130 is open the second switch 128 is closed, or vice versa.

In the present example, the feedback branch 103 includes a variable capacitor 134 (C2) having a first terminal coupled to a reference potential 136 and a second terminal coupled to a first terminal of the first switch 130. The reference potential 136 may, for instance, be ground. The feedback branch 103 further includes a variable resistor 124 (R2) having a first terminal coupled to a second terminal of the first switch 130 and a second terminal coupled to a supply voltage 122. The variable resistor 124 and the variable capacitor 134 may be programmable for reasons that will be described in greater detail below.

In this embodiment, the feedback branch 103 includes an output node 123. The output node 123 is coupled between the first terminal of the variable resistor 124 and the second terminal of the first switch 130. The output node 123 is configured to output a feedback voltage $V_{fb}$ of the feedback branch 103 to the second input 143 of the amplifier 140. Notably, the second switch 128 has a first terminal coupled to the first terminal of the variable capacitor 134 and a second terminal coupled to a node between the second terminal of the variable capacitor 134 and the first terminal of the first switch 130.

In this embodiment, the function of the feedback branch 103 is to convert a frequency signal, namely the output clock signal 146, into a feedback voltage, $V_{fb}$, to provide to the amplifier 140. As noted above, the first switch 130 and the second switch 128 are controlled by the feedback input 147. When the second switch 128 is closed (whereby the first switch 130 is open), the variable capacitor 134 discharges to the reference potential 136 (e.g. ground). On the other hand, when the second switch 128 is open (whereby the first switch 130 is closed), the variable capacitor 134 begins charging. This process can create a switching capacitance resistor between the reference potential 136 to the output node 123. The equivalent resistance, $R_{out}$, of the switching capacitance resistor of the feedback branch 103 has the value:

$$R_{out} = M/(C2 * f_{out}) \quad \text{(Eq. 3)}$$

where:

C2=capacitance of the variable capacitor 134,

M=M divider 142 (integer value), and $f_{out}$=frequency of the output clock signal 146.

The switching capacitance resistor of the feedback branch 103 and the variable resistor 124 divide the supply voltage 122, $V_{supply}$, giving a feedback voltage, $V_{fb}$, on the output node 123 having a value:

$$V_{fb} = \frac{V_{supply} * R2}{(R2 + R_{out})} \quad \text{(Eq. 4)}$$

where:

R2=resistance of the variable resistor 124.

In the present example, the reference voltage, $V_{ref}$, and the feedback voltage, $V_{fb}$, are sent to the inputs 141, 143 of the amplifier 140 so as to generate a control voltage ($V_{cnt1}$) at the output 145 of the amplifier 140. As mentioned previously, the output 145 of the amplifier 140 is coupled to the VCO 144, which converts $V_{cnt1}$ into a frequency value to generate the output clock signal (clkout).

As well as forming the output clock signal 146, the output of the VCO 144 forms the start of a feedback loop through the feedback branch 103 as described above. Accordingly, $V_{-ref}$ and $V_{fb}$ may operate to control the amplifier 140 and VCO 144 so as to lock the output clock signal 146 to a desired value (e.g. clkin or a multiple/fraction thereof).

To achieve $V_{fb}=V_{ref}$, it is required that:

$$\frac{V_{supply} * R1}{(R1 + R_{ref})} = \frac{V_{supply} * R2}{(R2 + R_{out})} \quad \text{(Eq. 5)}$$

Solving the equation for the output clock signal frequency, $f_{out}$, using Eq. 1 and Eq. 3:

$$f_{out} = f_{in} * \left(\frac{R1}{R2}\right) * \left(\frac{C1}{C2}\right) * \left(\frac{M}{N}\right) \quad \text{(Eq. 6)}$$

From the equation the frequency ratio between the input reference clock signal 102 and the output clock signal 146 has no relationship with the process, the temperature coefficient or the supply voltage and therefore the output clock signal 146 may be made independent of temperature variations, manufacturing process variations and such like.

As mentioned above, the M divider 142 and the N divider 104 may be individually programmable. The M divider 142 and the N divider 104 may be used to compensate for larger frequency differences between the input reference clock signal 102 and the output clock signal 146. Optionally, the large frequency differences that the M divider 142 and the N divider 104 can compensate for, can range between 8× or higher, 0.125× or lower. Accordingly, the accuracy of the clock circuit 100 may be improved.

As highlighted previously, the variable resistors 110/124 may be individually programmable. The variable resistors 110/124 of the reference 101 and feedback 103 branches may be used to compensate for smaller frequency differences between the input reference clock signal 102 and the output clock signal 146. Optionally, the minor frequency differences that the variable resistors 110/124 can compensate for, can range between 0.25× and 4×. As noted above, the variable capacitors 116/134 may also be individually programmable. The variable capacitors 116/134 of the reference 101 and feedback 103 branches may be used to compensate for a mismatch between the variable resistor 110 of the reference branch 101 and the variable resistor 124 of the feedback branch 103. An example of different scenarios where programming may be required can be seen below:

TABLE 1

Output frequency programming and tunning strategy of the programmable elements.

| $f_{out}/f_{in}$ | M and N | R1/R2 |
|---|---|---|
| 8~32 | 8 and 1 | 1~4 |
| 4~8 | 4 and 1 | 1~2 |
| 2~4 | 2 and 1 | 1~2 |
| 1/2~2 | 1 and 1 | 1/2~2 |
| 1/4~1/2 | 1 and 2 | 1/2~1 |
| 1/8~1/4 | 1 and 4 | 1/2~1 |
| 1/32~1/8 | 1 and 8 | 1/4~1 |

As shown in FIG. 1, the reference branch 101 may further include a filter capacitor 114 having a first terminal coupled to the reference potential 118 of the reference branch 101 and a second terminal coupled to the output node 107 of the reference branch 101. The feedback branch 103 may also include a filter capacitor 132 having a first terminal coupled with the reference potential 136 of the feedback branch 103 and a second terminal coupled to the output node 123 of the feedback branch 103. The filter capacitors 114/132 may be used to suppress voltage ripple in their respective output nodes 107/123.

Figure 2:
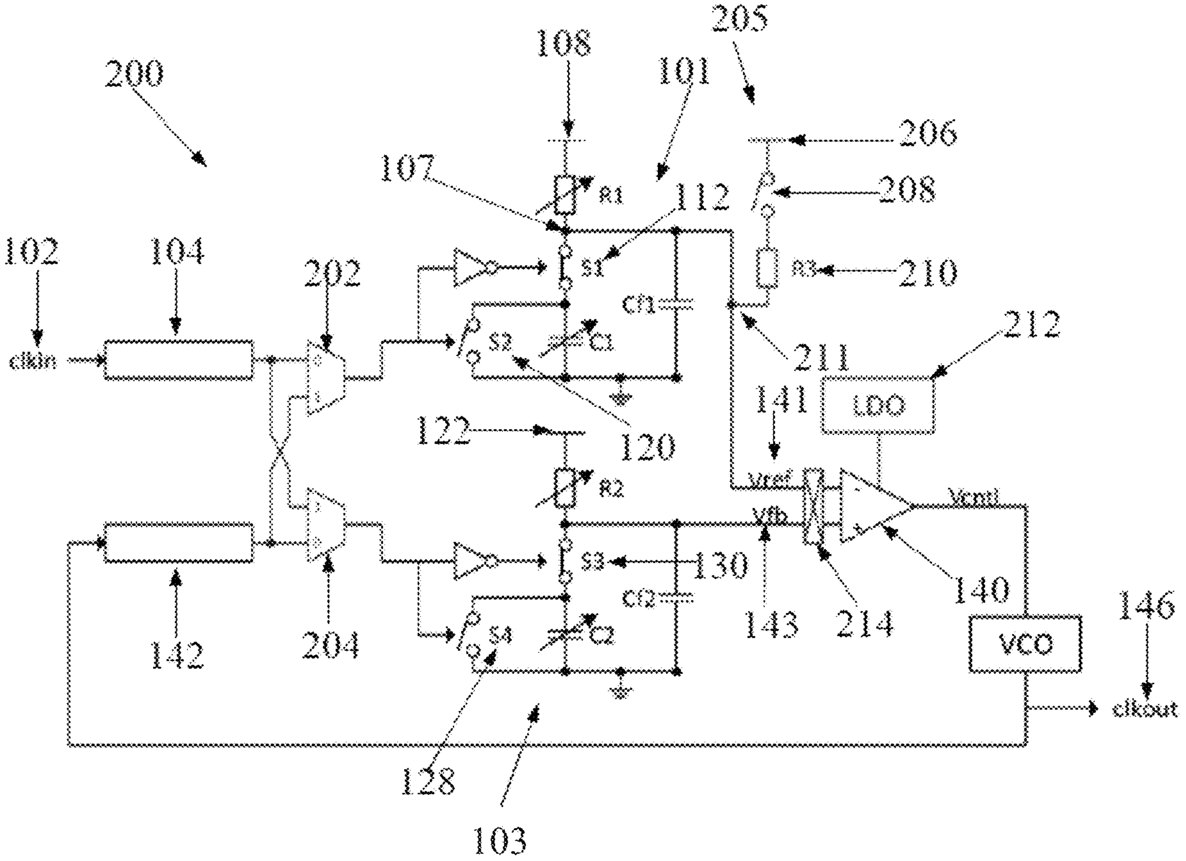
FIG. 2 shows a clock circuit, according to another embodiment.

FIG. 2 shows a clock circuit 200 of the kind shown in FIG. 1 with some additional optional features, such as a Low Dropout Regulator 212 (LDO). The LDO 212 may be coupled to the amplifier 140, for supplying power to the amplifier 140 and suppressing noise from the supply voltage 108 of the reference branch 101 and the supply voltage 122 of the feedback branch 103. The clock circuit 200 may further include a chopper 214, coupled to the inputs of the amplifier 140, for eliminating main output frequency errors such as an offset and a drift contributor.

In this embodiment, the clock circuit 200 of FIG. 2 includes a further branch 205. The further branch 205 may be coupled to the clock circuit 200 through a node 211 coupled between the output node 107 of the reference branch 101 and the first input 141 of the amplifier 140. The further branch 205 comprises of a resistor 210 (R3) with a first terminal coupled to the node 211, a switch 208, with a first terminal coupled to a second terminal of the resistor 210 and a supply voltage 206, with a first terminal coupled to the second terminal of the switch 208. The further branch 205 can be used when the input reference clock signal 102 is not available, allowing the clock circuit 200 to maintain oscillation of its feedback loop. The output clock signal 146 of the case where the input reference clock signal 102 is not available is equal to:

$$f_{out} = \frac{1}{(R3 * C2)} * \left(\frac{R1}{R2}\right) * M \quad \text{(Eq. 7)}$$

where:

R3=resistance of the resistor of the further branch 210.

In the present embodiment, the clock circuit 200 of FIG. 2 may include a first multiplexer 202, having a first input coupled to the input reference clock signal 102 (optionally via the N divider 104), a second input coupled to the output of the VCO 144 (optionally via the M divider 142) and an output coupled to the first switch 112 and the second switch 120 of the reference branch 101 as described above. In the present embodiment, the clock circuit 200 of FIG. 2 may also include a second multiplexer 204, having a first input coupled to the input reference clock signal 102 (optionally via the N divider 104), a second input coupled to the output of the VCO 144 (optionally via the M divider 142) and an output coupled to the first switch 130 and the second switch 128 of the feedback branch 103 as described above. The first multiplexer 202 and the second multiplexer 204 may allow the user to ensure that the reference branch 101 works in a higher frequency than the feedback branch 103. This can allow complex rail to rail inputs to the amplifier 140 to be avoided.

Accordingly, there has been described a clock circuit comprising a voltage-controlled oscillator having an input coupled to an output of an amplifier, and an output, outputting an output clock signal. The clock circuit further comprises, a reference branch and a feedback branch, both comprising, a first switch coupled to an input via an inverter and a second switch coupled to the input. The branches also both comprise, a variable capacitor coupled to a reference potential and coupled to the first switch, and a variable resistor coupled to the first switch. Both branches comprise a supply voltage coupled to the variable resistor and an output node, wherein the second switch is coupled to the variable capacitor and coupled to a node. The reference branch input is an input clock signal and the output is a reference voltage, and the feedback branch input is an output clock signal and the output is a feedback voltage.

Although particular embodiments of the invention have been described, it will be appreciated that many modifications/additions and/or substitutions may be made within the scope of the claimed invention.

The invention claimed is:

1. A clock circuit comprising:

an amplifier having a first input, a second input, and an output;

a voltage controlled oscillator having an input coupled to the output of the amplifier and an output for outputting an output clock signal of the clock circuit;

a reference branch comprising:

an input for receiving an input reference clock signal having a frequency $f_{in}$;

a first switch coupled to the input via an inverter, for control of the first switch by the input reference clock signal, a second switch coupled to the input, for control of the second switch by the input reference clock signal, a variable capacitor having a first terminal coupled to a reference potential and a second terminal coupled to a first terminal of the first switch, a variable resistor having a first terminal coupled to a second terminal of the first switch, a supply voltage node coupled to a second terminal of the variable resistor, and an output node coupled between the first terminal of the variable resistor and the second terminal of the first switch to output a reference voltage of the reference branch to the first input of the amplifier, wherein the second switch has a first terminal coupled to the first terminal of the variable capacitor and a second terminal coupled to a node between the second terminal of the variable capacitor and the first terminal of the first switch; and a feedback branch comprising:

a feedback input coupled to the output of the voltage controlled oscillator for receiving the output clock signal of the clock circuit, a first switch coupled to the feedback input via an inverter, for control of the first switch by the output clock signal of the clock circuit, a second switch coupled to the feedback input, for control of the second switch by the output clock signal of the clock circuit, a variable capacitor having a first terminal coupled to the reference potential and a second terminal coupled to a first terminal of the first switch of the feedback branch, a variable resistor having a first terminal coupled to a second terminal of the first switch of the feedback branch, a supply voltage node coupled to a second terminal of the variable resistor of the feedback branch, and an output node coupled between the first terminal of the variable resistor of the feedback branch and the second terminal of the first switch of the feedback branch to output a feedback voltage of the feedback branch to the second input of the amplifier, wherein the second switch of the feedback branch has a first terminal coupled to the first terminal of the variable capacitor of the feedback branch and a second terminal coupled to a node between the second terminal of the variable capacitor of the feedback branch and the first terminal of the first switch of the feedback branch.

2. The clock circuit of claim 1, wherein the reference branch also comprises a filter capacitor, having a first terminal coupled to the reference potential of the reference branch and a second terminal coupled to the output node of the reference branch.

3. The clock circuit of claim 1, wherein the feedback branch comprises a filter capacitor, having a first terminal coupled with the reference potential of the feedback branch and a second terminal coupled to the output node of the reference branch.

4. The clock circuit of claim 1, wherein the reference branch further comprises an N divider coupled between the input of the reference branch and the first switch and the second switch of the reference branch.

5. The clock circuit of claim 1, wherein the feedback branch further comprises an M divider coupled between the feedback input and the output of the voltage controlled oscillator.

6. The clock circuit of claim 4, wherein the feedback branch further comprises an M divider coupled between the feedback input and the output of the voltage controlled oscillator, and wherein the M divider and the N divider are programmable for compensating for frequency differences between the input reference clock signal and the output clock signal.

7. The clock circuit of claim 1, wherein the clock circuit comprises a Low Dropout Regulator, LDO, coupled to the amplifier, for supplying power to the amplifier and suppressing noise from the supply voltage.

8. The clock circuit of claim 1, wherein the clock circuit comprises a chopper, coupled to the input of the amplifier, for eliminating main output frequency errors such as, an offset and a drift contributor.

9. The clock circuit of claim 1, wherein the clock circuit comprises a further branch comprising:

a node coupled between the output node of the reference branch and the first input of the amplifier;

a resistor, with a first terminal coupled to the node;

a switch, with a first terminal coupled to a second terminal of the resistor; and a supply voltage, with a first terminal coupled to the second terminal of the switch.

10. The clock circuit of claim 1, wherein the clock circuit further comprises a first multiplexer, having a first input coupled to the input reference clock signal, a second input coupled to the output of the voltage controlled oscillator and an output coupled to the first switch and the second switch of the reference branch.

11. The clock circuit of claim 1, wherein the clock circuit also comprises a second multiplexer, having a first input coupled to the output of the voltage controlled oscillator, a second input coupled with the input reference clock signal and an output coupled to the first switch and the second switch of the feedback branch.

12. The clock circuit of claim 1, wherein the variable resistor of the reference branch and the variable resistor of the feedback branch are programmable for compensating for frequency differences between the input reference clock signal and the output clock signal.

13. The clock circuit of claim 1, wherein the variable capacitor of the reference branch and the variable capacitor of the feedback branch are programmable for compensating for differences in resistance between the variable resistor of the reference branch and the variable resistor of the feedback branch.

14. A microcontroller unit, MCU, or a microprocessor unit, MPU, comprising a clock circuit, the clock circuit comprising:

an amplifier having a first input, a second input, and an output;

a voltage controlled oscillator having an input coupled to the output of the amplifier and an output for outputting an output clock signal of the clock circuit;

a reference branch comprising:

an input for receiving an input reference clock signal having a frequency $f_{in}$, a first switch coupled to the input via an inverter, for control of the first switch by the input reference clock signal, a second switch coupled to the input, for control of the second switch by the input reference clock signal, a variable capacitor having a first terminal coupled to a reference potential and a second terminal coupled to a first terminal of the first switch, a variable resistor having a first terminal coupled to a second terminal of the first switch, a supply voltage node coupled to a second terminal of the variable resistor, and an output node coupled between the first terminal of the variable resistor and the second terminal of the first switch to output a reference voltage of the reference branch to the first input of the amplifier, wherein the second switch has a first terminal coupled to the first terminal of the variable capacitor and a second terminal coupled to a node between the second terminal of the variable capacitor and the first terminal of the first switch; and a feedback branch comprising:

a feedback input coupled to the output of the voltage controlled oscillator for receiving the output clock signal of the clock circuit, a first switch coupled to the feedback input via an inverter, for control of the first switch by the output clock signal of the clock circuit, a second switch coupled to the feedback input, for control of the second switch by the output clock signal of the clock circuit, a variable capacitor having a first terminal coupled to the reference potential and a second terminal coupled to a first terminal of the first switch of the feedback branch, a variable resistor having a first terminal coupled to a second terminal of the first switch of the feedback branch, a supply voltage node coupled to a second terminal of the variable resistor of the feedback branch, and an output node coupled between the first terminal of the variable resistor of the feedback branch and the second terminal of the first switch of the feedback branch to output a feedback voltage of the feedback branch to the second input of the amplifier, wherein the second switch of the feedback branch has a first terminal coupled to the first terminal of the variable capacitor of the feedback branch and a second terminal coupled to a node between the second terminal of the variable capacitor of the feedback branch and the first terminal of the first switch of the feedback branch.

15. The microcontroller unit or microprocessor unit of claim 14, wherein the reference branch further comprises an N divider coupled between the input of the reference branch and the first switch and the second switch of the reference branch.

16. The microcontroller unit or microprocessor unit of claim 14, wherein the feedback branch further comprises an M divider coupled between the feedback input and the output of the voltage controlled oscillator.

17. The microcontroller unit or microprocessor unit of claim 15, wherein the feedback branch further comprises an M divider coupled between the feedback input and the output of the voltage controlled oscillator, and wherein the M divider and the N divider are programmable for compensating for frequency differences between the input reference clock signal and the output clock signal.

18. The microcontroller unit or microprocessor unit of claim 15, wherein the clock circuit comprises a further branch, comprising:

a node coupled between the output node of the reference branch and the first input of the amplifier;

a resistor, with a first terminal coupled to the node;

a switch, with a first terminal coupled to a second terminal of the resistor; and a supply voltage, with a first terminal coupled to the second terminal of the switch.

19. The microcontroller unit or microprocessor unit of claim 14, wherein the variable resistor of the reference branch and the variable resistor of the feedback branch are programmable for compensating for frequency differences between the input reference clock signal and the output clock signal.

20. The microcontroller unit or microprocessor unit of claim 14, wherein the variable capacitor of the reference branch and the variable capacitor of the feedback branch are programmable for compensating for differences in resistance between the variable resistor of the reference branch and the variable resistor of the feedback branch.

* * * * *